United States Patent
Spartiotis et al.

(10) Patent No.: US 6,509,203 B2
(45) Date of Patent: *Jan. 21, 2003

(54) SEMICONDUCTOR IMAGING DEVICE AND METHOD FOR PRODUCING SAME

(75) Inventors: Konstantinos Evangelos Spartiotis, Athens (GR); Miltiadis Evangelos Sarakinos, Geneva (CH); Tom Gunnar Schulman, Masala (FI)

(73) Assignee: Simage, Oy, Espoo (FI)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/949,734

(22) Filed: Oct. 14, 1997

(65) Prior Publication Data

US 2002/0000549 A1 Jan. 3, 2002

(30) Foreign Application Priority Data

Oct. 18, 1996 (GB) .............................................. 9621747

(51) Int. Cl.[7] .............................................. H01L 21/00
(52) U.S. Cl. .............................. 438/48; 438/93; 438/94; 257/441; 257/442; 257/443
(58) Field of Search ................................ 257/441, 442, 257/443, 448, 435; 250/515.1, 370.1, 370.09, 370.08, 370.14, 394; 438/66, 95, 98, 48, 93, 94

(56) References Cited

U.S. PATENT DOCUMENTS

| | | | |
|---|---|---|---|
| 4,231,149 A | | 11/1980 | Chapman et al. .............. 29/578 |
| 4,467,342 A | | 8/1984 | Tower .......................... 357/30 |
| 4,604,634 A | * | 8/1986 | Feigt et al. .................. 346/160 |
| 4,734,588 A | * | 3/1988 | Akai .......................... 250/370 |
| 4,783,594 A | * | 11/1988 | Schulte et al .......... 250/370.08 |
| 4,891,522 A | | 1/1990 | Coon et al. ............... 250/370.1 |
| 4,937,453 A | * | 6/1990 | Nelson ................... 250/370.09 |
| 5,237,197 A | | 8/1993 | Snoeys et al. ............... 257/458 |
| 5,303,282 A | * | 4/1994 | Kwasnick et al. ........... 378/147 |
| 5,354,982 A | * | 10/1994 | Nelson et al. ......... 250/214 LA |
| 5,552,607 A | * | 9/1996 | Salisbury et al. ....... 250/370.09 |
| 5,591,959 A | | 1/1997 | Cigna et al. ............. 250/208.1 |
| 5,780,871 A | * | 7/1998 | den Boer et al. ............. 257/59 |
| 5,821,567 A | * | 10/1998 | Ogihara et al. ................ 257/88 |
| 5,880,470 A | * | 3/1999 | Umetani et al. ........ 250/370.09 |
| 6,188,089 B1 | * | 2/2001 | Spartiotis .................... 257/188 |

FOREIGN PATENT DOCUMENTS

| | | |
|---|---|---|
| EP | 0 275 217 A2 | 7/1988 |
| EP | 0 293 094 A2 | 11/1988 |
| EP | 0 437 340 A2 | 7/1991 |
| EP | 0 654 825 A1 | 5/1995 |
| EP | 0 657 938 A1 | 6/1995 |
| WO | WO 95/33332 A2 | 12/1995 |
| WO | WO 95/33332 | 12/1995 |

* cited by examiner

*Primary Examiner*—Steven Loke
*Assistant Examiner*—Donghee Kang
(74) *Attorney, Agent, or Firm*—Kenyon & Kenyon

(57) ABSTRACT

In a semiconductor imaging device, the distance between the edge of a substrate and an edge-most charge collection contact is made as small as possible, preferably less than 500 μm and/or less than ⅓ of the substrate thickness. Additionally or alternatively, a passivation layer is placed between the edge-most portion of the contact and the substrate surface and/or a field shaping conductor adjacent to the surface. A field shaping region may also be arranged outside the edge of the substrate and may encircle each detector device, or it may encircle an arrangement of several devices. In such an arrangement, the spacing between adjacent detectors should be less than 500 μm. A shield may also be used to shield the edge of each detector, or the edge region of the arrangement of several detectors, from incident radiation. Such arrangements can reduce the effect of edge image deterioration caused by strong field non-uniformities at the detector edges.

4 Claims, 6 Drawing Sheets

SEMICONDUCTOR IMAGING DEVICE AND METHOD FOR PRODUCING SAME

FIELD OF THE INVENTION

The present invention relates generally to the field of imaging, and in particular to semiconductor imaging devices and methods of producing such devices.

BACKGROUND OF THE INVENTION

A variety of semiconductor imaging devices are known in the art. Such devices typically comprise semiconductor material such as cadmium telluride (CdTe), cadmium zinc telluride (CdZnTe), mercury iodide ($HgI_2$), indium antimonide (InSb), gallium arsenide (GaAs), geranium (Ge), titanium bromide (TiBr), lead iodide (PbI) and silicon (Si). For example, an imaging pixel semiconductor system is disclosed in published International Patent Application WO-A-95/33332 owned by the assignee hereof. The contents of that document are incorporated herein by reference.

Known silicon-based semiconductor imaging devices have been implemented with a continuous grounded metal guard ring or pattern in electrical contact with the semiconductor material and encompassing the pixel contacts. The guard ring is formed on the sensitive face of the semiconductor material in the pixel plane adjacent to the edge of the material. The guard ring can improve electric field uniformity at the edge of the material which might otherwise cause image deterioration.

In such devices, however, the guard ring occupies a significant area of the sensitive surface, creating a substantial "inactive" area around the periphery of the detector face. The region is inactive in the sense that it is extremely difficult or impossible to detect photons incident in this region, since any charge created by absorption of photons flows immediately to ground via the grounded guard ring. Typically, the pixel pitch might be as small as 35 μm, and the width of the guard ring might be at least as big, if not significantly bigger (typically the width is in the range 25–500 μm). The inactive area causes particular problems when several individual detectors are used together to form a tiled detector surface. The combined effect of the guard rings of adjacent tiles can create a blind area of 1 mm or more in width at the region of the tile edges. Such a blind area is unacceptable for high-sensitivity or high-resolution imaging.

Embodiments of the present invention are directed to solving these and other problems with known imaging devices.

SUMMARY OF THE INVENTION

According to embodiments of the present invention, edge deterioration effects in a semiconductor imaging device may be reduced or substantially eliminated by arranging an edge-most contact element or elements on the surface of the semiconductor material sufficiently close to the edge of the material. In one such embodiment, the distance between the edge of at least one charge collecting contact of a semiconductor imaging device and the edge of the semiconductor material is between 0 and about 500 μm and/or between 0 and a value not significantly greater than ⅓ of the thickness of the semiconductor material.

By arranging at least some of the edge-most contacts close to the edge of the semiconductor material, the field non-uniformities may be displaced closer to the edge of the semiconductor material and, if the spacing is sufficiently small, extend at least partly beyond (i.e., outside) the semiconductor volume. It will be appreciated that a reduction in the size of the semiconductor region affected by the non-uniformities will achieve a corresponding reduction in Image Deterioration Effect (IDE) at the edge of the detector.

The spacing between the edge of the semiconductor material and the outermost edge or edges of the (or each) pixel contact may be made sufficiently small to reduce or alleviate IDE in the detector when in use. Generally, best results are achieved if the spacing is made as small as possible.

Applying the teachings of the present invention, suitable spacing for any particular semiconductor detector can be found by routine investigation, such as by routine experimentation or by simulation of the electrostatic fields as described herein. For example, in accordance with embodiments of the present invention, the spacing may be configured not significantly greater than about ⅕, or about 1/15, or about 1/30, or about 1/50, of the semiconductor thickness (with increasing preference for smaller fractions). Such ratios of spacing/thickness can provide increasingly better results in alleviating edge IDE. Likewise, the edge spacing may be configured not significantly greater than about 300 μm, or 100 μm, or 50 μm or 30 μm (with increasing preference for smaller values). These values match the above fractions for a semiconductor thickness of 1.5 mm, but can also be applied irrespective of the semiconductor thickness in other cases. In still other embodiments, selected ones of the foregoing values may also be combined to give a preferred spacing of not significantly greater than about ⅓ (or ⅕, etc.) of the semiconductor thickness if greater than 1.5 mm, and not significantly greater than about 500 μm (or 300 μm, etc.) if the semiconductor thickness is generally equal to or less than 1.5 mm.

Various methods can be used to produce semiconductor imaging devices having an edge spacing as described above. According to one embodiment of such a method, the contact(s) are formed on the surface of a pre-cut (or pre-formed) semiconductor substrate of a desired size using photolithography. Modern photolithographic techniques can be used to form a contact within about 50 μm of the substrate edge. According to another embodiment, the contact(s) may be formed on the surface of an oversized substrate using any convenient technique, and the edge of the substrate then cut close to the edge-most contact(s). Modern cutting techniques can be used to form a cut to a precision of about 10 μm or better.

According to yet another embodiment, an edge-most portion of at least one charge collecting contact of a semiconductor imaging device is spaced from the surface of the semiconductor material by passivation material. For example, the edge-most contacts may have a step profile (or at least the side of the contact adjacent to the semiconductor material may have a step profile) and be arranged so that the portion which steps away from the surface of the semiconductor substrate extends towards the edge of the semiconductor substrate. This takes into account that strong field non-uniformities are believed only to exist in the semiconductor material very close to the surface on which the charge collection contacts are mounted. By spacing the edge-most portion of the contact from the semiconductor surface, and introducing a passivation layer, the most intense field is confined to the non-sensitive passivation material where no breakdown effect is possible. Such a technique may be particularly effective when used in combination with the previously-discussed technique of positioning the edge-most charge collection contact(s) close to the edge of the semiconductor material.

In yet another embodiment, a non-sensitive field shaping region may be arranged outside, but adjacent to, at least one edge of the semiconductor imaging device. Such an arrangement can avoid reducing the area on which charge collection contacts can be mounted (which is a deficiency of using a guard ring), yet still provide a field shaping or controlling effect to reduce edge IDE problems. For example, the field shaping region may comprise non-sensitive material within which is or are arranged one or more field shaping strips. The positions of the strips, and the potential(s) applied to the strips can be chosen to achieve the desired field shaping. Different potentials can be applied to different strips if desired. The field shaping region may extend around the periphery of each single detector element. Additionally, or alternatively, the field shaping region may extend around the external periphery of a detector made up of a number of separate detector units (e.g., tiles) positioned side-by-side.

According to another embodiment of the present invention, two or more detector units may be arranged in very close proximity with each other, or in direct contact with each other. Typically, the detectors may be arranged with a gap of not significantly more than 500 $\mu$m. With increasing preference for smaller gaps, the spacing is more preferably not significantly greater than about 300 $\mu$m, or about 100 $\mu$m, or about 50 $\mu$m or less (which is equivalent to direct contact). With such close "spacing," the strong edge field non-uniformities of one detector may at least partially cancel out the corresponding edge non-uniformities of an adjacent detector, and thereby reduce the likelihood of edge IDE. This proximity of neighboring tiles on an imaging support plane is feasible with existing positioning and aligning methods. Such a technique may be most effective when used in combination with the technique of positioning the edge-most charge collection contact(s) very close to the edge of the semiconductor material and/or in combination with the technique of using passivation between an edge-most portion of a contact and the semiconductor material.

In yet another embodiment, a window region may be defined on the radiation receiving surface of a semiconductor imaging device, or of an arrangement of several devices, for receiving incident radiation. The window region would be smaller than the overall surface of the device or devices. Accordingly, one or more regions of the surface are shielded from receiving incident radiation. With such a technique, incident radiation can be confined to a region of the semiconductor material where strong field non-uniformities are absent. Preferably, at least one edge region of the substrate is shielded to prevent charge being produced in the edge region vulnerable to IDE. One feature of IDE is that once a charge avalanche has started, the avalanche affects not only the closest charge collecting contact, but also spreads to affect other contacts in the vicinity. By reducing the "window" of the detector even by a modest amount to reduce the amount of incident radiation in regions of strong field non-uniformity, and thereby suppress IDE, a significant improvement may be achieved. In one form, the window region may correspond to the area in alignment with the charge collecting contacts formed on the opposite surface of the semiconductor material. Alternatively, the window region may be slightly smaller than this, so that some of the edge-most contacts are in the shielded region.

In accordance with another embodiment, at least a portion of a field shaping conductor adjacent to the surface of the semiconductor material of a semiconductor imaging device is spaced from the surface by passivation material. Preferably, the conductor is insulated electrically from the semiconductive material by the passivation material. Therefore, in contrast to known approaches, a field shaping, or "guard," conductor should not make electrical contact with the surface of the semiconductor material. By electrically isolating the field shaping conductor from the semiconductor material, charge created by incident photons cannot flow out through the conductor. Instead, the charge is available to flow towards an adjacent charge collection contact, as a detectable output. The proximity of the conductor to the semiconductor material nevertheless enables it to provide a field shaping, or "guard," effect to reduce field non-uniformities at the edge of the semiconductor material. The conductor may be coupled to ground, or to some other potential, for this purpose.

With the above arrangement using the field shaping conductor, the sensitivity of the detector in the edge regions can thus be improved, but the presence of the guard ring may limit the resolution in the edge region of the detector. It is preferred that the width of the guard conductor on the semiconductor surface be not significantly greater than about 100 $\mu$m, so that it does not occupy too much surface area. With a guard conductor of this width, the "hole" in the resolution at the detector edge is also about 100 $\mu$m.

The foregoing embodiments and/or features thereof may be used independently or in combination. In contrast to the teaching of the prior art, the above aspects can enable incident radiation to be detected in the peripheral region of the semiconductive material. This provides an extremely important advantage in improving the sensitivity of the detector in the edge regions, and can enable the size of "dead" or "blind" regions of the detector to be reduced compared to currently known devices. According to embodiments of the present invention, two or more detectors can be arranged in a one-, two- or three-dimensional pattern (such as a tiled detector surface) and can provide a much more uniform sensitivity across the entire width of the detection surface than is possible with current technology. Moreover, embodiments of the present invention can reduce or even alleviate field non-uniformities at the edge of the detector sensitive area while, at the same time, achieving a sensitive area which is maximal and substantially equal to the total area of the detector.

DETAILED DESCRIPTION

Figure 1:
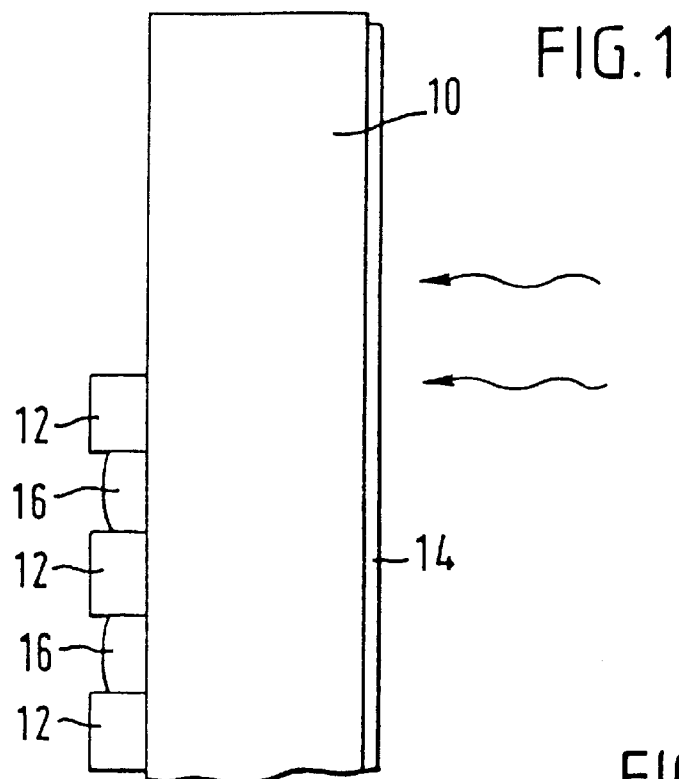
FIG. 1 is a schematic view of a monolithic radiation detector used to illustrate the Image Deterioration Effect.

In connection with development of the present invention, an implementation of a detector system using CdZnTe as the semiconductor material was studied. CdZnTe is a desirable material (and may be preferred to Si) due to its high absorption efficiency for photon energies up to 90 keV. A high absorption efficiency is advantageous, because it means that X-ray images can be produced using lower doses of radiation. Monolithic CdZnTe detectors (illustrated schematically in FIG. 1) having an imaging area of 15×7 mm² and a thickness t of about 1.5 mm were tested with X-ray energies from 20 to 100 KeV. In these detectors, charge collecting (pixel) metal contacts 12 are arranged on one face of the detector material 10. The opposite face, the backplane, is covered with a continuous metal contact 14 extending to the detector edge. Incident radiation 11 enters the detector through the backplane. It will be appreciated that, in FIG. 1, all relative dimensions are arbitrary and the figure is not drawn to scale. The pixel pitch is 35 µm, and the pixel metal contacts 12 start at from 0.6 to 1.6 mm from the detector edge. A passivation layer 16 is introduced between adjacent pixel contacts to prevent crosstalk. Before each image acquisition cycle, the pixel contacts 12 were reset to 5 V and the backplane 14 (the plane of incident radiation) was kept at a bias voltage $V_b$=350 V. Images were taken of standard test objects with X-ray tube voltages ranging from 40 to 110 kV. The tube voltage defines the maximal photon energy incident on the detector.

Image deterioration was observed for tube voltages over 60 kV. The observed image deterioration commenced at the detector edges, and the extent of deterioration was observed to increase with increasing X-ray tube voltage. The deterioration was observed to consist of a white-out of the output signals from the edge of the detector, indicative of overloading or swamping of the detector signals. The deterioration was observed to be worst at pixels near the detector edges, becoming progressively better away from the edges. This effect is referred to as the Image Deterioration Effect (IDE).

As part of these studies, a frame was introduced to shield the edge regions of the detector from incident radiation. This significantly improved image quality. It was concluded that the occurrence of IDE at high energies might be caused by high-energy photons interacting with the semiconductor material near the pixel plane (i.e., metal contact plane). Furthermore, the occurrence of IDE near the detector edges might be associated with the electric field non-uniformities near the outermost contact pixel edges.

In effect, the detector system may be considered as a parallel plate capacitor, the backplane conductor 14 forming one plate, and the pixel contacts 12 forming the other plate. The fringe field near the capacitor edges causes the electric field strength to be several times higher in magnitude near the edge compared to its uniform value elsewhere. Moreover, the electric field vector in the region of the non-uniformity has a high component along the direction parallel to the plane of the pixel contacts (the x-y plane in FIG. 1). It is believed that IDE is caused by high-energy photons reaching these high field regions, which causes an avalanche charge to be created in the region of the edgemost pixel contacts. The signal produced from the pixel contact is far in excess of the usual pixel signal level, and overloads the electronic circuitry for reading the signal.

The detector backplane 14 was covered completely by a gold layer of thickness 0.22 µm. The continued occurrence of IDE at higher photon energies supports the above hypothesis that the IDE is not caused by the backplane metallization edges. Further evidence supporting the above developed hypothesis is provided by observation of the detector system behavior at lower bias voltages: application of $V_b$=100 V at the backplane electrode 14 eliminated the edge IDE problem despite causing a general deterioration of image contrast as a result of lower charge collection efficiency and higher charge diffusion.

Figure 2:
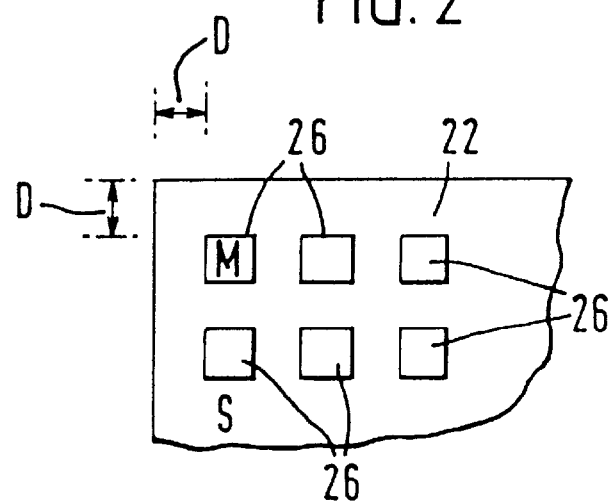
FIG. 2 is a schematic plan view of one corner of pixel surface of a semiconductor imaging device according to an embodiment of the present invention.
Figure 3:
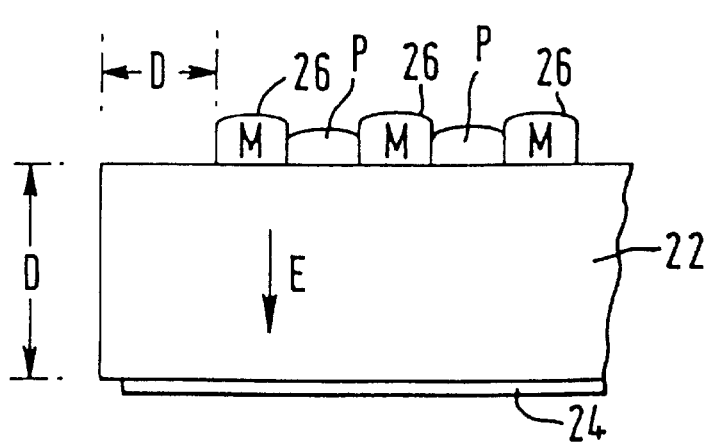
FIG. 3 is a schematic side view of the detector region illustrated in FIG. 1.

Referring now to FIGS. 2 and 3, according to a first embodiment of the present invention a semiconductor X-ray imaging device 20 includes a semiconductor substrate 22 on one face of which is formed a backplane conductive layer 24, and on the other face of which are formed a plurality of metal contacts 26. The semiconductor imaging device may formed from the materials identified above, but the present invention is not limited in this respect. The detector operates in a similar manner to that described in the above-referenced International Patent Application WO-A-95/33332, and so the basic operation is not described in detail herein. The contacts 26 act as charge collection contacts through which electronic circuitry (not shown) can read out charge signals generated by the absorption of X-ray radiation incident through the backplane 24.

This embodiment takes advantage of the observation in accordance with one aspect of the invention that the IDE does not occur near the backplane where the entire detector area is covered with a continuous metal layer extending to the detector edge. In this embodiment, the distance D between the substrate edge and the outermost cell metal contacts at the cell contact plane are sufficiently small (and preferably minimized within practical limits) that IDE can be avoided in the pixel plane.

As the distance D is lowered, the non-uniformities in the edge electric field are believed to be pushed near the detector edge and eventually extend partially beyond the detector volume. There is believed to be a correlation between the detector thickness and the electric field non-uniformity: the thinner the detector, the higher the non-uniformity, and therefore, the smaller the desirable distance D. In this particular embodiment, with a 1.5 mm thick detector, the effect of field non-uniformities begins to moderate when the distance D becomes lower than 500–300 µm. More preferably, this effect becomes less significant if the distance D becomes lower than 100 µm, and even more preferably, this effect becomes even less significant if the distance D becomes 30 µm or lower. Although the drawings illustrate a detector which is generally symmetrical in two dimensions, it will be appreciated that this is not an essential feature. For example, in FIG. 2 the horizontal distance D need not necessarily be the same as the vertical distance D. Furthermore, the corresponding distances D at the opposite edges of the detector need not be the same.

The shape of the metal contacts is not necessarily square, as shown in FIG. 2, but can take any shape (for example, circular, parallelogram (strip-like) polygonal, etc.).

Figure 4:
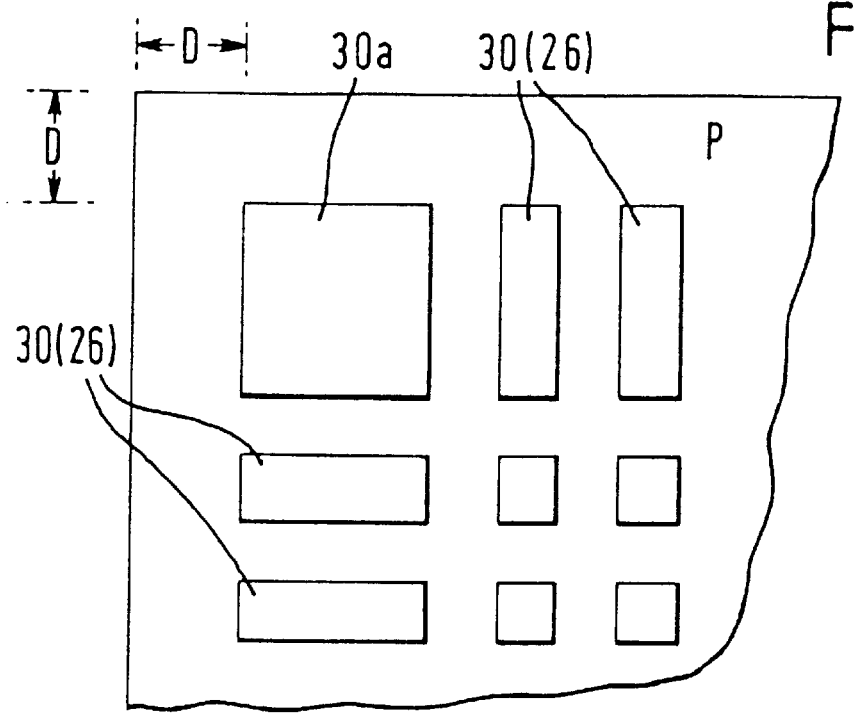
FIG. 4 is a schematic plan view of a semiconductor imaging device according to an embodiment of the present invention.

Furthermore, the shapes and sizes of contacts of different cells are not necessarily identical to one another (see, for example, the arrangement in FIG. 4). In FIG. 4, the outermost rows and columns of contacts 30 are shaped so that they extend towards the detector edge or edges. The corner metal contact 30a is larger in order to keep the edge distance D small.

Detectors in accordance with these embodiments may typically be produced in at least two ways. The first way is to form directly as many metal contacts as needed in position relative to an edge of the substrate, to achieve the desirable minimal or sufficiently small distance D. In this way, the minimum achieved distance D is limited only by the accuracy of the particular photolithography technique used. With conventional photolithography techniques, charge collecting metal contacts can be implemented as close as 50 $\mu$m from the detector edge (for CdTe or CdZnTe).

The alternative second way of producing a detector in accordance with these embodiments is to form the metal contacts on a substrate of larger dimensions than is ultimately needed, and to remove excess semiconductive material from at least one edge (for example, by cutting). The precision of modern cutting techniques (for example, diamond cutting) is around 10–20 $\mu$m.

A particular advantage achieved by the embodiments of FIGS. 2 to 4 is that the edge region of the semiconductive material is actively sensitive (in that incident photons can be detected even close to the edge). The proximity of the metal contacts to the edge of the substrate helps reduce IDE at the detector edge. Moreover, the proximity of the metal contacts to the substrate edge means that image resolution is not sacrificed in the edge region. A plurality of such detectors may be used side-by-side, for example, to produce a tiled imaging detector surface. Such a surface would have more uniform sensitivity and better resolution than that achievable hitherto.

Figure 5:
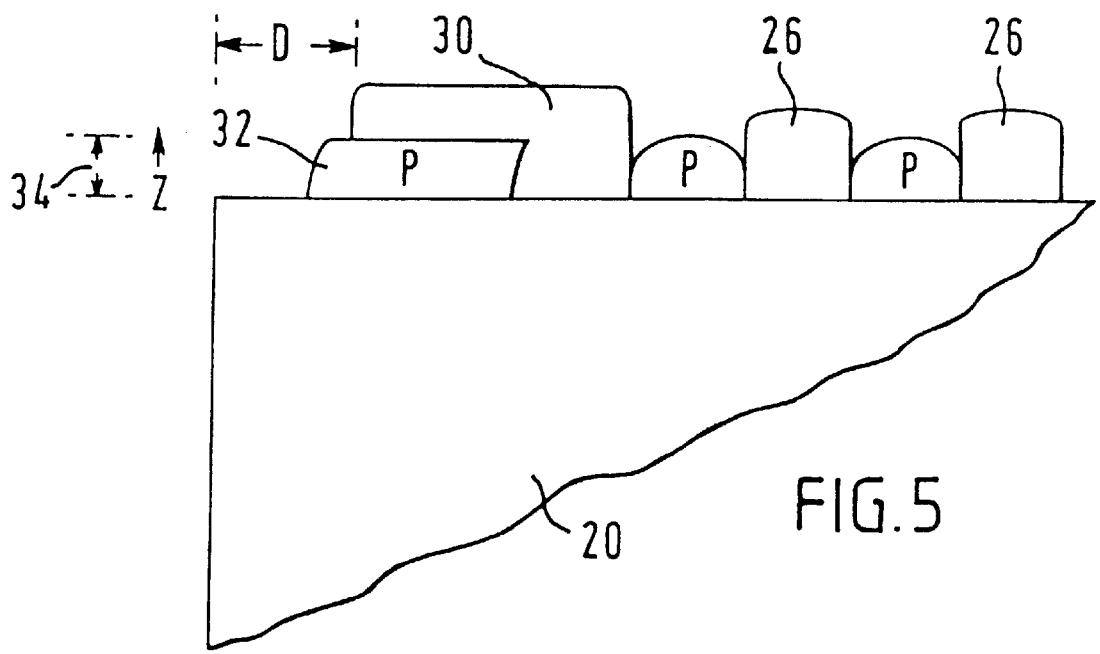
FIG. 5 is a schematic side view of a semiconductor imaging device according to an embodiment of the present invention.

Referring now to FIG. 5, another embodiment of the present invention uses a passivation layer 32 under a portion of the edge-most metal contacts 30. With such a passivation layer, the largest part of the field non-uniformity will extend in a non-sensitive medium such as the passivation. For example, the thickness 34 of the passivation layer can be several $\mu$m thick. This embodiment takes into account the fact that the field nonuniformities increase with decreasing magnitude of distance z to the metal contacts 30. Although not essential, this embodiment also uses a "minimum" or at least sufficiently small edge distance D, to reduce the intensity of the field non-uniformities at the edge. Such a combination can confine the most intense electric field in a non-sensitive medium such as outside the semiconductive material, and/or in the edge passivation 32 where no breakdown effect is possible.

Figure 6:
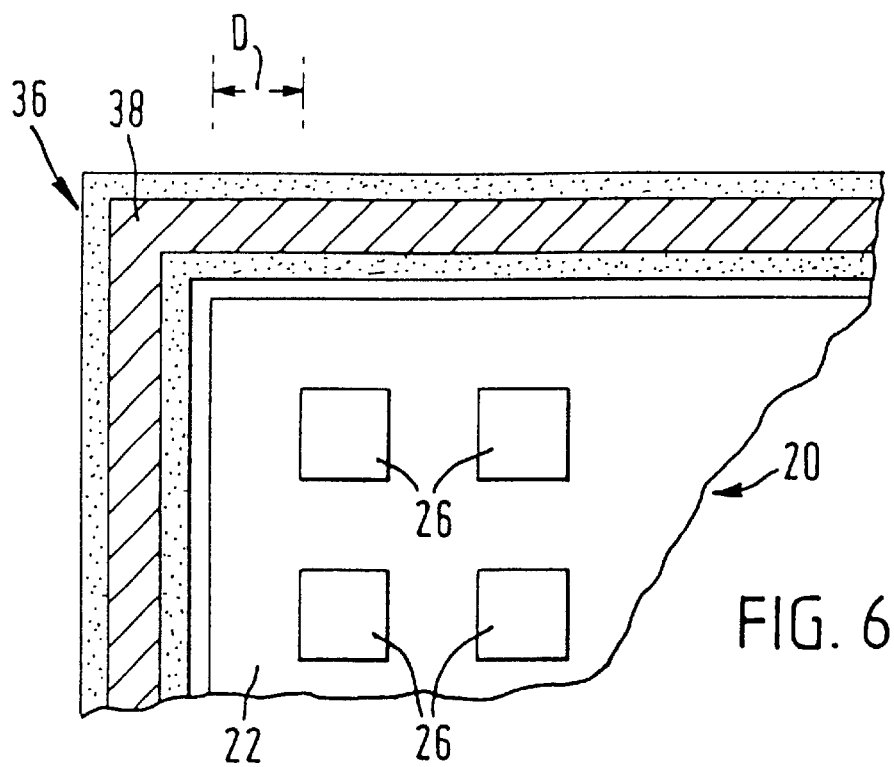
FIG. 6 is a schematic plan view of a semiconductor imaging device according to an embodiment of the present invention.
Figure 7:
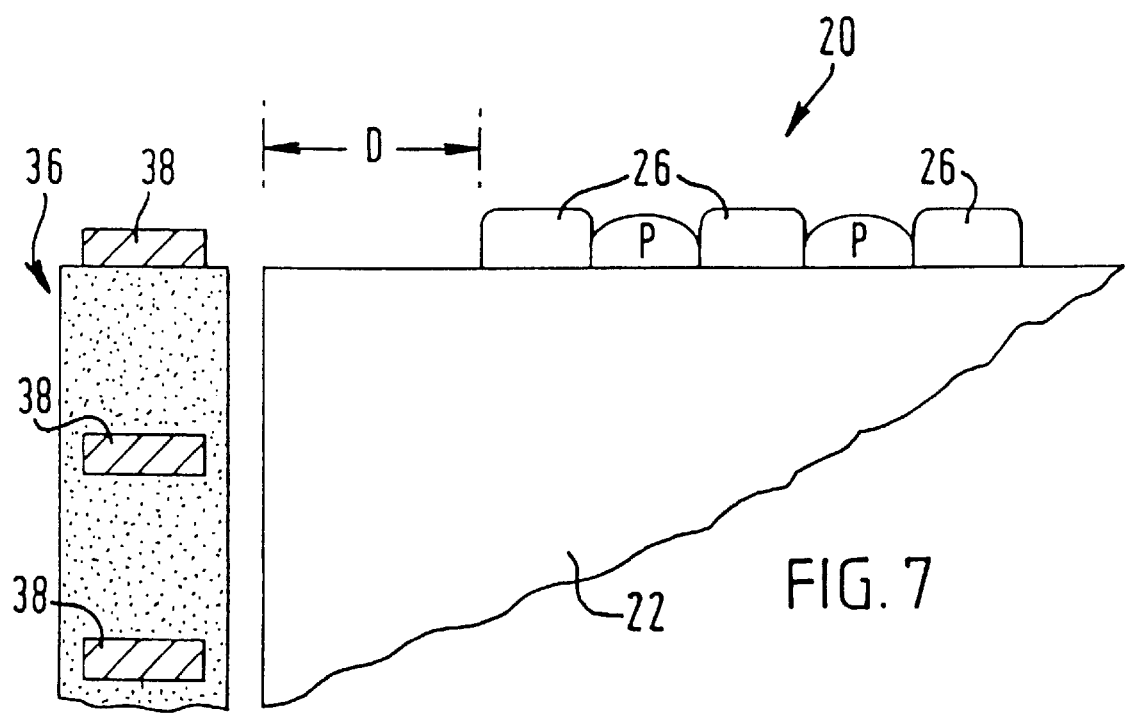
FIG. 7 is a schematic side view of the region of FIG. 6.

Referring to FIGS. 6 and 7, in accordance with another embodiment of the present invention, the semiconductor substrate 22 is surrounded with a non-detecting field shaping region 36, which lies outside, but closely adjacent to, the substrate. The region 36 may contain any number of field shaping metal strips 38, and one or more voltages can be applied to the strips. The voltages for the different field shaping strips 38 can be different from one another and are suitably chosen so as to achieve the desired field shaping. It is to be noted that the dimensions illustrated in FIGS. 6 and 7 are arbitrary. Furthermore, this embodiment (i.e., field shaping) can be used in conjunction with the other embodiments already described (e.g., extended edge metal contact, extended edge metal contact over a passivation layer).

Figure 8:
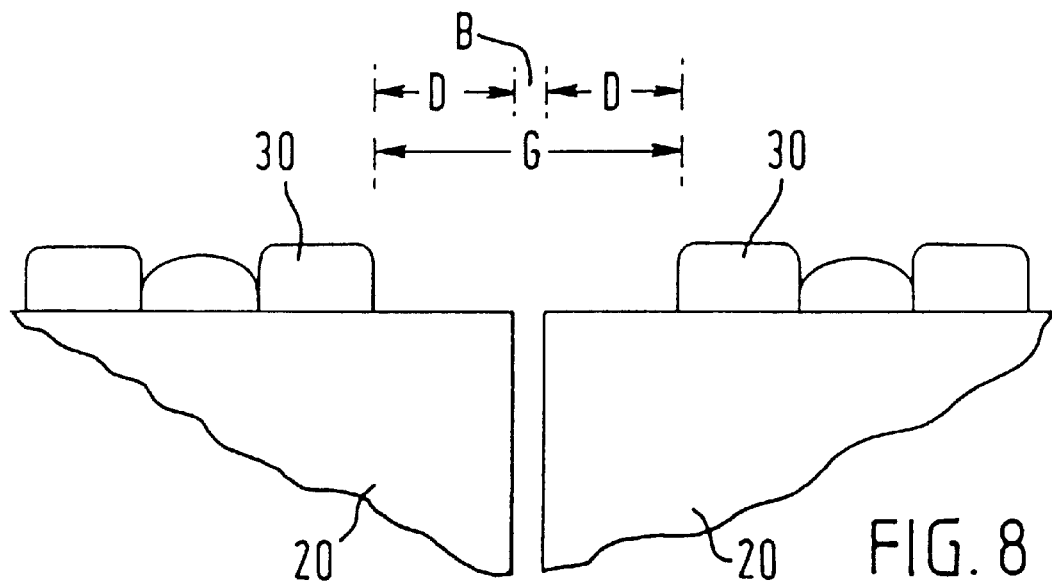
FIG. 8 is a schematic side view of a plurality of detector tiles according to an embodiment of the present invention.

In a further embodiment, the minimization of the edge distance D (as defined previously) can be used to remove field non-uniformities for a large-area imaging system comprising several monolithic detectors (tiles). Referring to FIG. 8, different detector tiles 20, each with a minimal edge distance D are placed side by side (the number of tiles and dimensions in this figure being arbitrary and not limiting). Field non-uniformities near the edge metal contacts 30 of neighboring tiles mutually cancel out to a large extent. The gap G between the neighboring edge metal contacts is G=2×D+B where B is the gap between the substrates of neighboring tiles. According to this embodiment, the distance B is also minimal. Preferably, this distance B is not greater than about 500–300 $\mu$m; more preferably, is not greater than around 100 $\mu$m; and even more preferably, B is 50 $\mu$m or less. This proximity of neighboring imaging tiles on an imaging plane is feasible with existing positioning and aligning methods. This embodiment of the invention (i.e., juxtaposition of tiles) can be used in conjunction with the other embodiments already described (e.g., extended edge metal contact, extended edge metal contact over a passivation layer).

Figure 9:
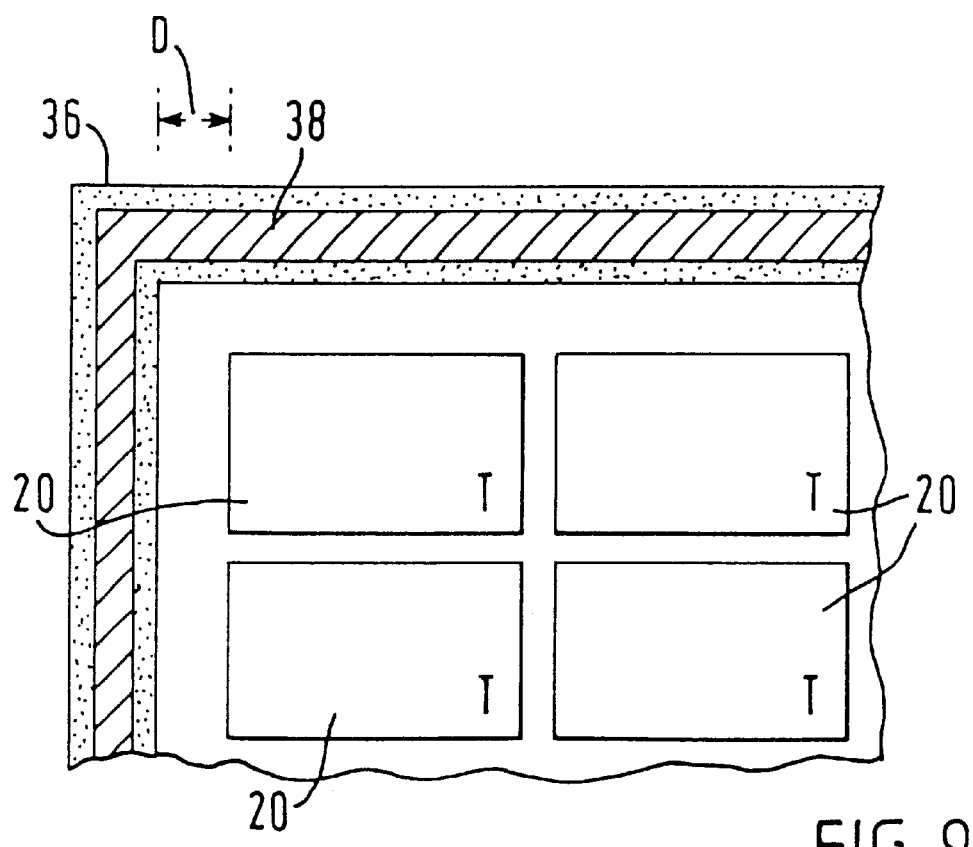
FIG. 9 is a schematic plan view of a plurality of detector tiles according to an embodiment of the present invention.

Referring to FIG. 9, according to another embodiment of the present invention, the use of a field shaping structure comprising a nonsensitive medium 36 and field shaping strips 38 (as described previously with reference to FIGS. 6 and 7) can be used to minimize field non-uniformities at the edges of a multi-tile system. The field shaping structure surrounds the multi-tile system, thus providing the necessary field shaping at the edges of the entire system. The dimensions and number of tiles illustrated in FIG. 9 are arbitrary and not limiting.

Figure 10:
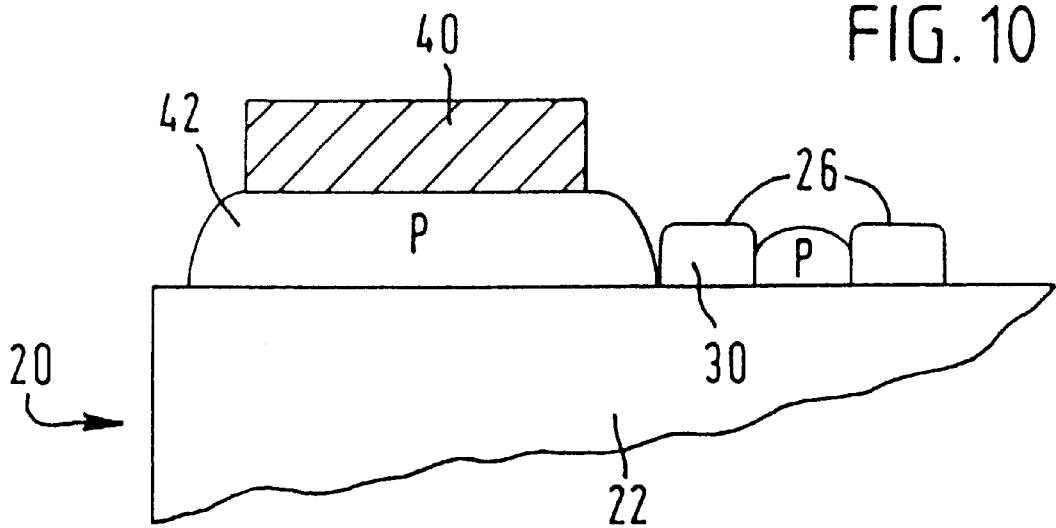
FIG. 10 is a schematic plan view of a semiconductor imaging device according to an embodiment of the present invention.
Figure 11:
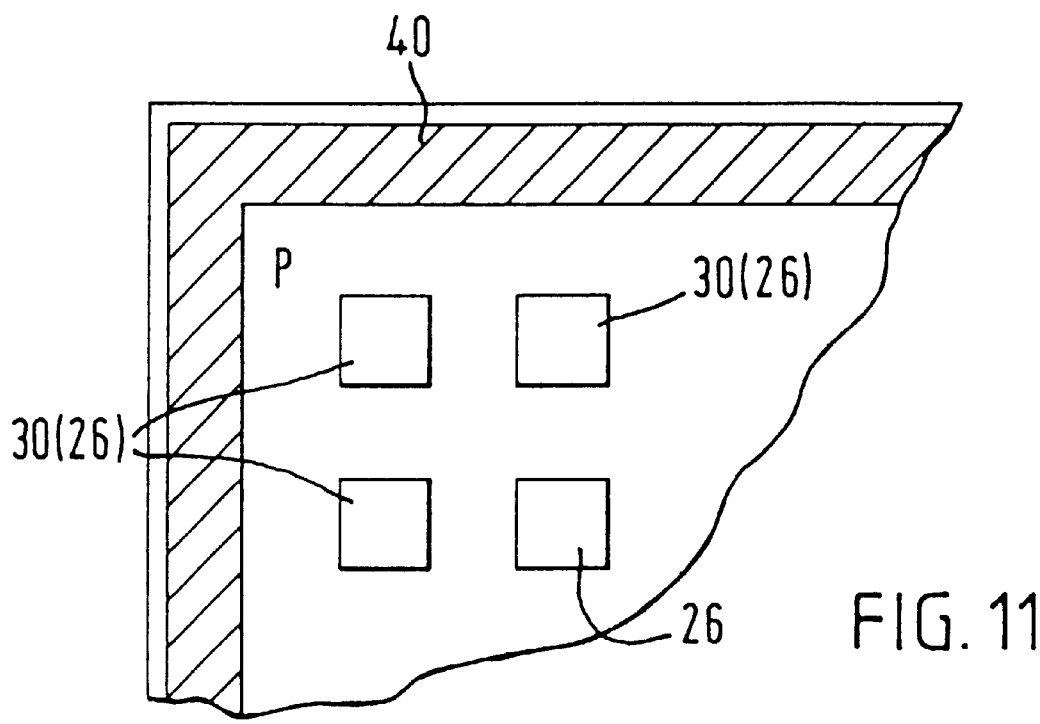
FIG. 11 is a schematic side view of the region of the detector shown in FIG. 10.

FIGS. 10 and 11 illustrate another embodiment which employs a guard metal conductor, but which can nevertheless achieve an active region corresponding to substantially the entire volume of the semiconductor substrate 22. In this embodiment, a guard ring conductor 40 is spaced from the surface of the semiconductor substrate 22, and is electrically insulated therefrom, by means of a passivation layer 42. The guard ring can extend the metallization to practically the very edge of the semiconductor substrate, and thus reduce the edge non-uniformities in the region of the edge-most contacts 30 which the guard conductor 40 surrounds. At the same time, since the guard ring 40 is not in electrical contact with the substrate 22, it does not sink any charges from the substrate. Any charge generated in the edge region of the substrate 22 by absorption of photons will drift towards the edge-most contacts 30, from which it can be collected as a useful signal. Thus, the substrate does not contain any inactive region, although the spatial resolution will be lower at the edges because the peripheral surface area is occupied by the guard ring 40 instead of by charge collecting contacts 30. For this reason, the width of the guard ring conductor 40 should not be too large. Typically it may be about 50–100 $\mu$m in width.

The voltage applied to the guard ring conductor 40 may be selected optimally so that each charge created by ionization below the guard ring will drift towards the nearest edge contact 30. For example, if the charge collection contacts are reset to about 5 volts, and a bias voltage of about −350 volts is applied to the backplane 24, then the potential applied to the guard ring conductor 40 may conveniently be 0 volts.

Figure 12:
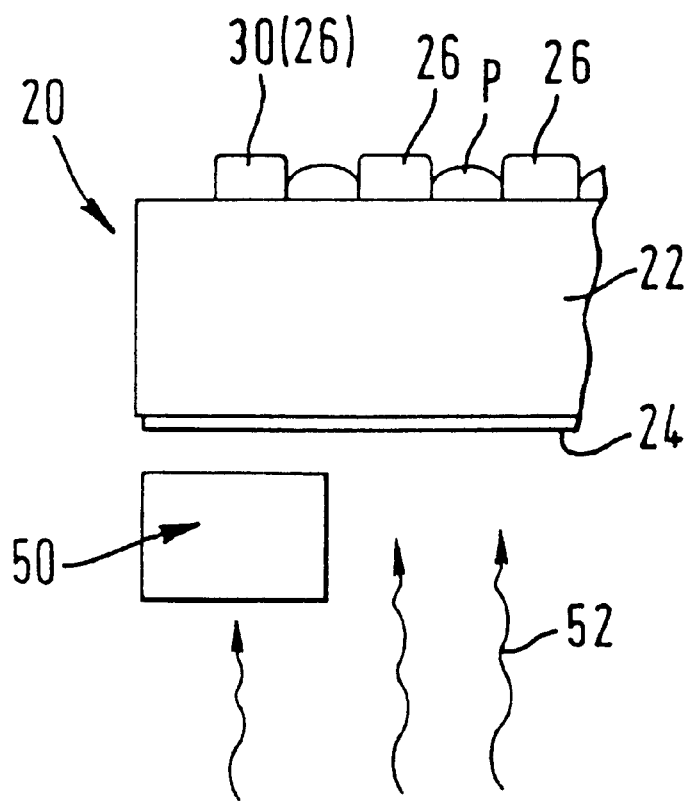
FIG. 12 is a schematic side view of a semiconductor imaging device employing a shield according to an embodiment of the present invention.
Figure 13:
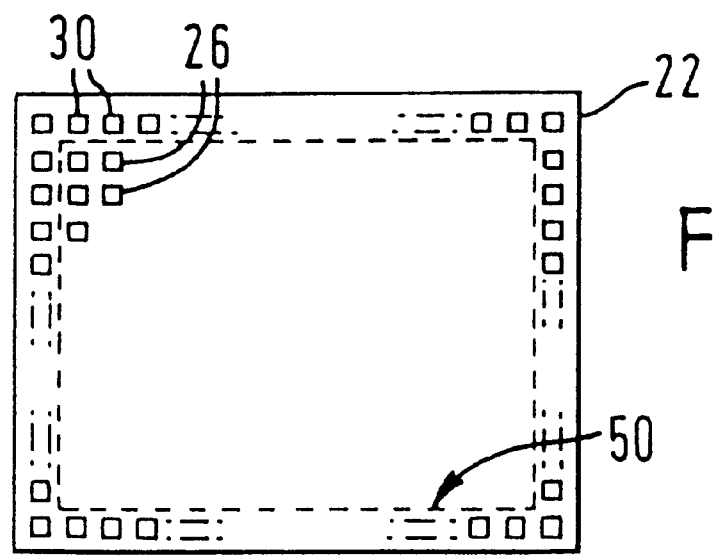
FIG. 13 is a schematic plan view of the detector of FIG. 12.

Referring to FIGS. 12 and 13, in accordance with another embodiment of the present invention, a shield (a frame 50 in this example) may be used to shield vulnerable edge regions of the substrate 22 from receiving incident radiation. Radiation 52 incident within the window region defined by the frame 50 is allowed to pass into the substrate 22, whereas radiation 54 incident outside the window region is blocked by the frame 50. The shield may be made of any suitable material for preventing the transmission therethrough of the radiation of interest, for example, steel for shielding X-rays.

By shielding the edge regions, the amount of charge generated at the edge regions where the field non-uniformities are strongest will be reduced. The effect of this is to suppress IDE, and to improve the image quality. As explained previously, the IDE has been observed to affect not only the outermost contacts, but any contacts in the same vicinity. Therefore, by suppressing IDE, image quality at the image edge and at regions inward of the edge can be significantly improved. This improvement can more than make up for the slight reduction in the size of the active area of the detector.

The shield may be arranged so that its inner edge is aligned outside the edge-most contacts 30, or it may be arranged so that it covers, or at least partly covers, one or more rows or columns of edge-most contacts (as illustrated in FIGS. 12 and 13). The shielding frame 50 is preferably positioned either in contact with, or very close to, the backplane 24 of the detector. Although a rectangular window defining frame 50 is illustrated, it will be appreciated that this is merely an example, and is not limiting. One or more continuous, or disparate, regions of the surface can be shielded as desired.

Alternatively, instead of applying the shielding frame to an individual detector, a large frame may be positioned to shield the edge region of an extended detector array formed from a plurality of individual detectors positioned side-by-side (defining a tiled or mosaic detector surface). With such an arrangement, the frame could, for example, be arranged to shield the peripheral region of each edge-most detector in the array. It will be appreciated that the shield is different from a collimator which may be used on a detector, because the shield in the above embodiments does not limit the angle of incidence of incoming radiation. Typically, it is desired only to shield the edge-most regions of the substrate surface which are vulnerable to strong field non-uniformities, and it is desired at the same time to provide a detector window which is as large as possible. Typically, the window would be several times bigger than a collimator aperture.

As illustrated above, embodiments of the present invention can improve the sensitivity in the edge region of a semiconductor imaging device, giving the device a more uniform sensitivity throughout its volume, and avoiding the occurrence of inactive regions as in the prior art. Furthermore, embodiments of the invention can improve the detection resolution at the detector edges, and can avoid, or at least reduce the effect of, resolution "holes" at the device's edges, which is a particular problem in known devices.

Although the present invention has been described in relation to X-ray detection and is particularly suitable in this field, embodiments of the invention can be used in many other applications, and is not intended to be limited only to the detection of X-rays. Accordingly, it will be appreciated that although particular embodiments of the invention have been described, many modifications/additions and/or substitutions may be made within the spirit and scope of the present invention as defined in the appended claims. Moreover, it is to be noted that combinations of features of the dependent claims other than those explicitly enumerated may be made with features of other dependent claims and/or independent claims, as appropriate, within the spirit and scope of the present invention.

What is claimed is:

1. A method of producing a semiconductor high energy radiation imaging device, said method comprising the steps of preparing a semiconductor substrate of a predetermined size for the imaging device, forming a conducting layer across substantially the whole of a first surface of said semiconductor substrate, and forming an array of charge collecting contacts on a second surface of the substrate, an edge-most charge collecting contact being formed at a distance between 0 and 500 $\mu$m from an edge of the substrate using a lithographic process, wherein an edge-most portion of the edge-most charge collecting contact is spaced from the surface of the semiconductor substrate by passivation material.

2. A method of producing a semiconductor high energy radiation imaging device, said method comprising the steps of forming a conducting layer across substantially the whole of a first surface of a semiconductor detector substrate, forming an array of charge collecting contacts on a second surface of said semiconductor substrate having an area greater than said array of charge collecting contacts, and removing material from the substrate adjacent to an edge to achieve an edge-to-contact distance between an edge-most charge collecting contact and an adjacent edge of said substrate of between 0 and 500 $\mu$m, wherein an edge-most portion of the edge-most charge collecting contact is spaced from the surface of the semiconductor substrate by passivation material.

3. A method of producing a semiconductor high energy radiation imaging device, said method comprising the steps of forming a conductive layer across substantially the whole of a first surface of a semiconductor detector substrate and forming an array of charge collecting contacts on a second surface of said semiconductor substrate having an area greater than said array of charge collecting contacts, and removing material from the substrate adjacent to an edge to achieve an edge-to-contact distance between an edge-most charge collecting contact and an adjacent edge of said substrate of between 0 and a value which is not significantly greater than 1/3 of the substrate thickness, wherein an edge-most portion of the edge-most charge collecting contact is spaced from the surface of the semiconductor substrate by passivation material.

4. A method of producing a semiconductor high energy radiation imaging device, said method comprising the steps of preparing a semiconductor substrate of a predetermined size for the imaging device, forming a conducting layer across substantially the whole of a first surface of said semiconductor detector substrate, and forming an array of charge collecting contacts on a second surface of the substrate, an edge-most charge collecting contact being formed at a distance between 0 and a value which is not significantly greater than 1/3 of the substrate thickness from an edge of the substrate using a lithographic process, wherein an edge-most portion of the edge-most charge collecting contact is spaced from the surface of the semiconductor substrate by passivation material.

* * * * *